(12) United States Patent
Matsumoto et al.

(10) Patent No.: US 7,113,530 B2
(45) Date of Patent: Sep. 26, 2006

(54) GALLIUM NITRIDE BASED SEMICONDUCTOR LASER AND IMAGE EXPOSURE DEVICE

(75) Inventors: Kenji Matsumoto, Kanagawa (JP); Toshiro Hayakawa, Kanagawa (JP)

(73) Assignees: Nichia Corporation, Tokushima (JP); Fuji Photo Film Co., Ltd., Kanagawa (JP)

( * ) Notice: Subject to any disclaimer, the term of this patent is extended or adjusted under 35 U.S.C. 154(b) by 188 days.

(21) Appl. No.: 10/329,511

(22) Filed: Dec. 27, 2002

(65) Prior Publication Data

US 2003/0123503 A1   Jul. 3, 2003

(30) Foreign Application Priority Data

Dec. 27, 2001   (JP) .............................. 2001-398414
Dec. 27, 2001   (JP) .............................. 2001-398417
Nov. 22, 2002   (JP) .............................. 2002-339877

(51) Int. Cl.
*H01S 5/00* (2006.01)
(52) U.S. Cl. ................................. 372/43.01; 372/46.01
(58) Field of Classification Search ................. 372/29, 372/43.01, 45.01, 46.01
See application file for complete search history.

(56) References Cited

U.S. PATENT DOCUMENTS

| | | | | |
|---|---|---|---|---|
| 4,603,420 | A | * | 7/1986 | Nishizawa et al. ............ 372/45 |
| 6,219,366 | B1 | * | 4/2001 | Furushima .................... 372/50 |
| 6,614,720 | B1 | * | 9/2003 | Ogata et al. ............ 369/112.28 |
| 6,740,869 | B1 | * | 5/2004 | Okino et al. ................. 250/236 |
| 6,850,547 | B1 | * | 2/2005 | Goto ......................... 372/43.01 |
| 2003/0052316 | A1 | * | 3/2003 | Nido et al. .................... 257/13 |

* cited by examiner

*Primary Examiner*—James Menefee
(74) *Attorney, Agent, or Firm*—Sughrue Mion, PLLC

(57) ABSTRACT

In order to obtain a visually high quality image with excellent sharpness using a silver halide photosensitive material, it is necessary to reduce the ratio of EL light in the light output from a GaN based laser diode to 20% or less. For example, when the light intensity measured on a sheet of photosensitive paper is 0.05 mW, the thickness of a waveguide is 3 nm and the width of the waveguide is 3 μm, this condition is satisfied with a length of a resonator being 1 mm or less. In other words, a waveguide width W1 and a resonator length L are set such that the product of the waveguide width W1 and the resonator length L (W1·L) becomes 0.003 $mm^2$ or less. This reduces the output ratio of the EL light, and a high quality image with excellent sharpness can be obtained when a silver halide photosensitive material is exposed.

27 Claims, 14 Drawing Sheets

SPOT 5

DIRECTION OF SCANNING

SPOT 5

PATTERN 7

GALLIUM NITRIDE BASED SEMICONDUCTOR LASER AND IMAGE EXPOSURE DEVICE

BACKGROUND OF THE INVENTION

1. Field of the Invention

The present invention relates to a gallium nitride (GaN) based semiconductor laser and an image exposure device. More particularly, the present invention relates to a GaN based semiconductor laser, which is used as a light source in an exposure device for exposing a silver halide photosensitive material, and an image exposure device using the GaN based semiconductor laser as a light source.

2. Description of the Related Art

Conventionally used semiconductor lasers include a gallium arsenic (GaAs) based semiconductor laser, which is formed by laminating semiconductor compounds, such as AlGaInP, AlGaAs, or InGaAsP, on a GaAs substrate. In the GaAs based semiconductor laser, in which GaAs is used in a substrate, either InGaAs or GaAs, used in a counter electrode, absorbs light within a wavelength range including an emission wavelength of the semiconductor laser. Therefore, the substrate or the counter electrode absorbs stray light resulting from electroluminescense (EL light). Further, when a stripe geometry has been employed, where emission light is confined within a narrow region which typically has a width of the order of several microns of an active layer, stray light out of the stripe region has rarely been a problem.

In recent years, an exposure apparatus for exposing a photosensitive material using a semiconductor laser has been utilized in various applications, one such application being a laser printer. In order to improve the quality of an exposed image, it is effective to shorten a wavelength of laser light to make the spot diameter of the laser beam as small as possible.

Development of a semiconductor laser with a shorter oscillation wavelength (hereinafter referred to as a "shorter wavelength laser,") such as a blue-violet semiconductor laser, is steadily progressing, and a GaN based semiconductor laser is approaching the realm of practical use. Since a sapphire substrate or a silicon carbide (SiC) substrate used in the GaN based semiconductor laser is transparent to light of an emission wavelength of the semiconductor laser, EL light is emitted in random directions. Further, stray light is reflected on the surface of the semiconductor chip and either returns to areas in the vicinity of the active region or is reflected several times to generate stray light of various patterns.

This unintended stray light causes a problem that, when a GaN based semiconductor laser is used as a light source of an exposing apparatus, it fails to provide a sharp-edged laser beam spot even if a small diameter of the beam is accomplished through manipulation of an optical system. Particularly, in a silver halide system, in which a highly sensitive silver halide photosensitive material is exposed to form a continuous tone high-quality photographic image, the ambiguous spot edge problem is critical, comparing with an electrophotography process, in which an image is formed of halftone dots.

For example, as shown in FIGS. 13A and 13B, when light output from a GaN based semiconductor laser 1 is condensed onto a surface of a sheet of photographic paper 3 through a lens 2, the laser light 4, which is laser-oscillated at a predetermined wavelength, forms a spot 5 having a predetermined size, accompanied by a pattern 7, which has an ambiguous edge due to EL light 6 having random emitting positions, random directions and random wavelengths. While the power of the order of 0.1 mW is sufficient for exposing the highly sensitive silver halide photosensitive material, intensity of the EL light on the sheet of photographic paper is significantly high, as shown in FIG. 14, even in the low-exposure-intensity range where the light intensity (light output) of the laser spot on the sheet of the photographic paper is about 0.1 mW. Therefore, for example, when a stripe pattern shown in FIG. 15A, in which each line formed has a width being the same as the diameter of the spot 5, areas between the lines are exposed by the EL light 6 and this results in a less sharp image, as shown in FIG. 15B.

SUMMARY OF THE INVENTION

In view of the aforementioned, an object of the present invention is to provide a gallium nitride based semiconductor laser and an image exposure device in which the output ratio of EL light is reduced, and which can produce a high quality image with excellent sharpness when exposing a silver halide photosensitive material.

In order to accomplish the above-described object, the gallium nitride based semiconductor laser according to the present invention is characterized in that a gallium nitride based semiconductor laser emitting laser light accompanied by stray light, wherein the ratio of an output of the stray light to the output of the laser light is reduced by setting a waveguide width, an active layer thickness and a resonator length such that the product of the waveguide width, the active layer thickness and the resonator length becomes a predetermined value, so that, when a photosensitive material is exposed to form a continuous tone image, areas on the photosensitive material being exposed by the stray light are not visually perceptible. The output ratio of the stray light to the output of the laser light is preferably reduced to 20% or less.

A first image exposure device according to the invention is an image exposure device for scan-exposing a photosensitive material to form an image thereon using laser light, comprising a gallium nitride based semiconductor laser emitting the laser light accompanied by stray light, wherein the ratio of an output of the stray light to an output of the laser light is reduced by setting a waveguide width, an active-layer thickness and a resonator length such that the product of the waveguide width, the active layer thickness and the resonator length becomes a predetermined value, so that, when a photosensitive material is exposed to form a continuous tone image, areas on the photosensitive material being exposed by the stray light are not visually perceptible.

The gallium nitride based semiconductor laser preferably has a resonator length of 0.1 mm or more, a waveguide width of 1 µm or more, and the product of the waveguide width and the resonator length being 0.003 mm² or less. The resonator length preferably ranges from 0.1 mm to 1 mm, the waveguide width preferably ranges from 1 µm to 4 µm, and the product of the resonator length and the waveguide width preferably ranges from 0.0002 mm² to 0.003 mm².

By using the gallium nitride based semiconductor laser in which the output ratio of the EL light is reduced as a light source in the image exposure device to expose a photosensitive material, a high quality image being excellent in sharpness can be obtained when a silver halide photosensitive material is exposed.

Since a silver halide photosensitive material has very high sensitivity, a laser power of 0.1 mW at a condensed spot on a sheet of photographic paper is sufficient for exposing 10 cm-square sheets of photographic paper at a rate of the order of 1000 to 2000 sheets per hour. Therefore, even if 90% of light is lost due to optical loss at an intermediary optical system such as a polygon mirror, a light output of about 1 mW at a light source is sufficient.

While a conventional semiconductor laser is generally designed to output from at least 1 mW, to as high as 20 mW or more, it also has a long resonator length (for example, 1 mm or more) and good heat dissipation properties, in order to accommodate a high-output operation. Further, since the life of a semiconductor laser is shortened as the light output density at an edge thereof is increased, a wider waveguide is preferable in a range where the semiconductor laser operates at a single-transverse mode, for example a selected waveguide width of 3 to 4 µm.

In general, the threshold current of a semiconductor laser increases as the resonator length increases, and EL light due to spontaneous emission of a carrier increases proportionally to the increase in the threshold current. EL light output around the threshold current of a semiconductor laser is proportional to the product of a carrier density n and a volume V of the region of an active layer into which a carrier is injected. Therefore:

$$\text{EL Light Output} \propto V \cdot n$$

Since the volume V of the region of the active layer, into which the carrier is injected, is a product of the sectional area S of the active layer and the resonator length L, the above equation is rewritten as follows:

$$\text{EL Light Output} \propto S \cdot L \cdot n$$

Further, if the active layer is uniform, the sectional area S of the active layer is the product of the waveguide width W1 and the thickness of the active layer ta. Therefore, the above equation is further rewritten as follows:

$$\text{EL Light Output} \propto W1 \cdot L \cdot ta \cdot n$$

However, a gallium nitride based semiconductor laser has a multi-quantum well structure, and in such a multi-quantum well structure, EL light output does not necessarily increase proportionally to the increase in the thickness of the active layer. In the multi-quantum quantum well structure, quantum wells are separated by barrier layers having a band gap larger than that of the quantum wells. Electrons and holes are injected from opposite sides of the multi-quantum well, and therefore, the efficiency of carrier injection is lowered as the number of wells is increased since the electrons and the holes have to pass through more barrier layers. Further, in a gallium nitride based semiconductor laser, when semiconductor layers having different lattice constants are laminated, a piezo-electric field is generated. Therefore, if the width of the well is large, the inclination of energy in the well becomes large, and the spatial overlapping between wave functions of the electrons and the holes decreases, thereby lowering the light emission efficiency.

Moreover, depending on crystal growth conditions of the active layer, the non-radiative recombination rate varies and the light emission efficiency changes greatly. Therefore, in general, the lower the quality of the crystal, the higher the number of wells required for obtaining the necessary gain for laser oscillation. Therefore, unlike the waveguide width W1 and the resonator length L, the thickness of the active layer ta in the multi-quantum well cannot be treated as a proportional element as in the previously stated equation. A quantum well structure and related fabrication conditions are formulated to substantially maximize light emission efficiency. In the quantum well structure and the related fabrication conditions, the thickness of the active layer ta can be regarded constant, and the above equation can be further rewritten as follows:

$$\text{EL Light Output} \propto W1 \cdot L \cdot n$$

Around a threshold current for obtaining a light output which is necessary for exposing a silver halide photosensitive material, a carrier density n is substantially constant as long as an optical loss such as the waveguide loss is not very large. Therefore, the intensity of EL light around the threshold current is roughly proportional to the product of the waveguide width and the resonator length (W1·L).

The inventors of the present invention have found through examination that, in order to obtain a visually high quality image with excellent sharpness by exposing a silver halide photosensitive material using a GaN based laser diode, it is necessary to suppress the ratio of light output of the EL light in the light output from the GaN based laser diode to 20% or less. It is believed that, by reducing the ratio of light output of the EL light, the silver halide photosensitive material is not exposed by the EL light to a visually perceptible extent, and that a visually high quality image with excellent sharpness can be obtained. In order to satisfy this condition, when the thickness of an active layer is uniform, it is necessary to set the waveguide width and the resonator length of the GaN based laser diode such that the product of the waveguide width and the resonator length is 0.003 mm² or less.

If the resonator length is too short, heat generation and mirror loss are increased, and problems such as an increase in the threshold current due to a gain saturation of the active layer are caused, thereby lowering reliability of the GaN based laser diode. Therefore, in order to ensure reliability, it is necessary to set the resonator length to 0.1 mm or more. On the other hand, if the waveguide width is too narrow, the light-output density at the edge increases as described above, and thus, reliability of the GaN based laser diode is lowered. Therefore, in order to ensure reliability, it is necessary to set the waveguide width to 1 µm or more.

Accordingly, when the GaN based laser diode, which inevitably emits EL light, is used as a light source for exposure in a silver halide system, the resonator length of 0.1 mm or more, the waveguide width of 1 µm or more, and the product of the waveguide width and the resonator length being 0.003 mm² or less can reduce the ratio of light output of the EL light in the light output from the GaN based laser diode to 20% or less without impairing reliability of the GaN based laser diode, and a high quality image with excellent sharpness can be obtained.

A second image exposure device according to the present invention is an image exposure device for scan-exposing a photosensitive material to form an image thereon using laser light, comprising a gallium nitride based semiconductor laser emitting the laser light accompanied by stray light, wherein the gallium nitride based semiconductor laser comprises a light-emitting layer for emitting the laser light, and a full angle of radiation where half maximum of the laser light is 35° or less.

As described above, since much stray light emitted from the GaN based semiconductor laser (for example, a GaN based semiconductor laser emitting blue laser light), when the GaN based semiconductor laser is used for scan-exposing a photosensitive material to form an image by irradiating laser light, an ambiguous area is produced around a spot of condensed light irradiated on the photosensitive material.

Now, the radiation angle of a GaN based semiconductor laser is considered. The radiation angle of laser light varies between that in a direction perpendicular to an active layer of the semiconductor laser and that in a direction parallel to the active layer. Generally, the radiation angle in the perpendicular direction is larger than that in the parallel direction. Therefore, an optical system including a condenser lens, which can condense laser light in the perpendicular direction, can sufficiently condense the laser light in the parallel direction. When a GaN based semiconductor laser having a large radiation angle is used as a laser source, much of stray light emitted from the GaN based semiconductor laser is also condensed onto the photosensitive material. As shown in FIG. 9, the smaller the radiation angle of the laser source, the smaller the amount of stray light condensed onto the photosensitive material.

When a silver halide photosensitive material is used, it is most desirable that energy at the ambiguous area due to stray light irradiated on the photosensitive material is one fifth or less of the light energy emitted from the GaN based semiconductor laser and condensed onto the photosensitive material. Reduction of the light energy of stray light condensed onto the photosensitive material to one fifth is accomplished by setting the angle of radiation to 35° or less. The radiation angle can be adjusted by changing a thickness of a guiding layer of the gallium nitride based semiconductor laser.

With consideration to above-described facts, by using a CaN based semiconductor laser, in which a radiation angle of the laser is 35° or less, the energy at the ambiguous area due to stray light irradiated on the photosensitive material can be reduced to one fifth or less of the light energy emitted from the GaN based semiconductor laser and condensed onto the photosensitive material, thereby suppressing the amount of stray light emitted from the GaN based semiconductor laser to be irradiated on the photosensitive material. Thus, the output ratio of EL light is reduced and a high quality image with excellent sharpness can be obtained when a silver halide photosensitive material is exposed. It should be noted that a radiation angle means a full angle of radiation at half maximum of the laser light emitted from a light-emitting layer of the GaN based semiconductor laser.

In addition, by using the CaN based semiconductor laser having a smaller full angle of radiation, the utilization efficiency of light is not lowered even when a lens having a smaller numerical aperture (NA) is used in a condensing optical system for condensing laser light onto the photosensitive material. This allows use of a lens having a smaller NA, and this can also reduce the ratio of stray light to be condensed onto the photosensitive material.

In the second image exposure device described above, it is preferable to use a gallium nitride based semiconductor laser, in which the ratio of an output of the stray light to an output of the laser light is reduced by setting a waveguide width, an active layer thickness and a resonator length such that the product of the waveguide width, the active layer thickness and the resonator length becomes a predetermined value, so that, when a photosensitive material is exposed to form a continuous tone image, areas on the photosensitive material being exposed by the stray light are not visually perceptible. This reduces the ratio of stray light to be condensed onto the photosensitive material, and a high quality image with excellent sharpness can be obtained.

Further, it is more preferable to use a gallium nitride based semiconductor laser having a resonator length of 0.1 mm or more, a waveguide width of 1 µm or more, and a product of the waveguide width and the resonator length of 0.003 mm$^2$ or less. This further reduces the ratio of stray light to be condensed onto the sheet of photographic paper, and an even higher quality image which is more excellent in sharpness can be obtained. From a practical point of view, the resonator length preferably ranges from 0.5 mm to 1 mm, and the radiation angle preferably ranges from 28° to 35°.

DETAILED DESCRIPTION OF THE INVENTION

Hereinafter, embodiments of the present invention are described in detail with reference to the drawings.

First Embodiment

In this embodiment, a gallium nitride (GaN) based laser (laser diode) according to the invention is applied as a light source for exposure in a Digital Lab System.

[Outline of Overall System]

Figure 1:
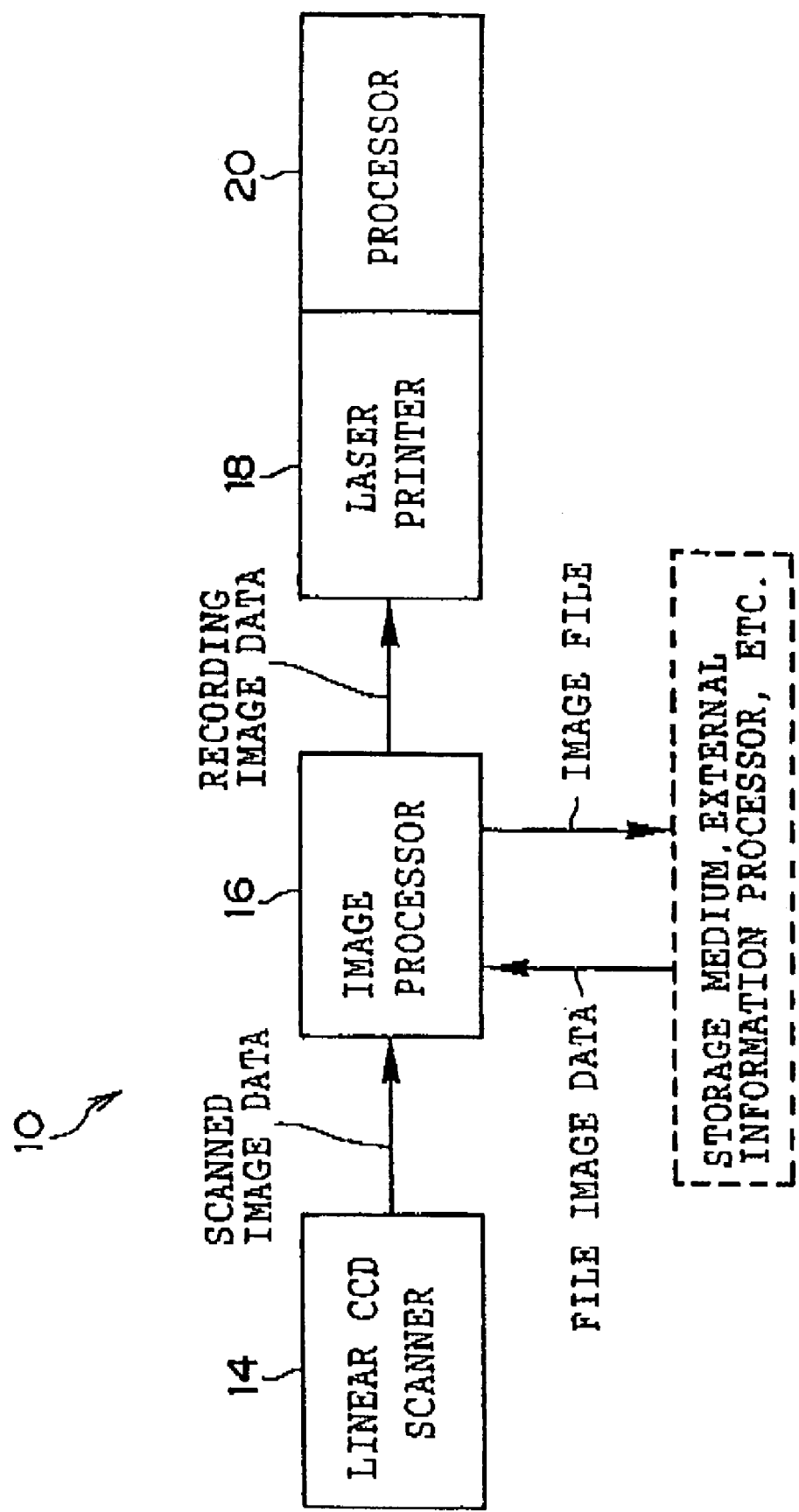
FIG. 1 is a block diagram showing an outline of a Digital Lab System according to a first embodiment.
Figure 2:
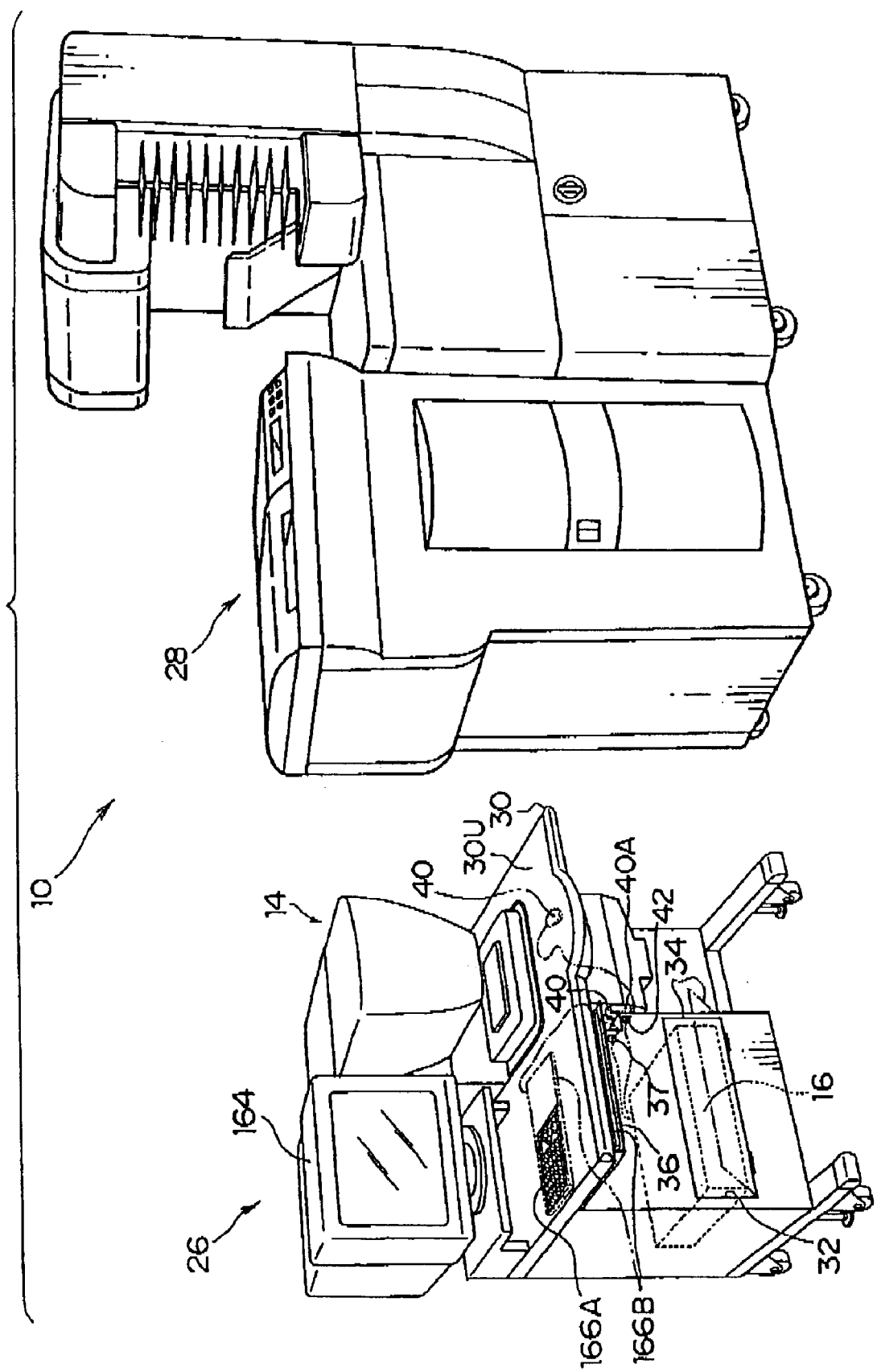
FIG. 2 is a perspective view showing an appearance of the Digital Lab System according to the first embodiment.

FIG. 1 schematically shows a configuration of a Digital Lab System 10 according to an embodiment of the present invention. FIG. 2 shows an appearance of the Digital Lab System 10. As shown in FIG. 1, the lab system 10 includes a linear CCD scanner 14, an image processor 16, a laser printer 18 serving as an image exposure device, and a processor 20. As shown in FIG. 2, the linear CCD scanner 14 and the image processor 16 are integrated as the input terminal 26, and the laser printer 18 and the processor 20 are integrated as the output terminal 28.

The linear CCD scanner 14 scans a film image (a negative or positive image which has been visualized through development after shooting a subject) recorded on a photographic photosensitive material, such as a photographic film such as a negative film or a reversal film (hereinafter, simply referred to as a "photographic film"). Examples of the photographic film to be scanned by the linear CCD scanner 14 include 135 size photographic films, 110 size photographic films, photographic films with a transparent magnetic layer formed thereon (240 size photographic films, known as APS films), and 120 size and 220 size (brownie size) photographic films. The linear CCD scanner 14 scans the above-described film image with a trilinear color CCD to output R, G and B image data.

As shown in FIG. 2, the linear CCD scanner 14 is mounted on a working table 30. The image processor 16 is accommodated in an accommodating section 32 formed below the working table 30. A door 34 is attached at an opening of the accommodating section 32. Usually, the door 34 is closed so that the inside of the accommodating section 32 is not exposed. When the door 34 is pivoted, the inside of the accommodating section 32 is exposed and the image processor 16 can be pulled out from the accommodating section 32.

Display 164 is mounted on rear surface of the working table 30. Further, two types of keyboards 166A and 166B are disposed at the working table 30. The keyboard 166A is embedded in the working table 30. The keyboard 166B, when it is not used, is accommodated in a drawer 36 of the working table 30, and when the keyboard 166B is used, it is removed from the drawer 36 and is placed next to the keyboard 166A. When the keyboard 166B is used, a connector (not shown) attached at a tip of a cord (signal line) extending from the keyboard 166B is connected to a jack 37 disposed at the working table 30, thereby electrically connecting the keyboard 166B with the image processor 16 via the jack 37.

Moreover, a mouse 40 is disposed on a working plane 30U of the working table 30. A cord (signal line) of the mouse 40 is extended into the accommodating section 32 through a hole 42 provided in the working table 30 and is connected to the image processor 16. When the mouse 40 is not used, it is accommodated in a mouse holder 40A, and when it is used, it is removed from the mouse holder 40A and is placed on the working plane 30U.

The image processor 16 is arranged such that image data (scanned image data) output from the linear CCD scanner 14 is input thereto, and also image data obtained by image shooting Using a digital camera, image data obtained by scanning an original other than a film image (such as a reflective original) with a scanner, image data generated using a computer, or the like (hereinafter, generally referred to as file image data) can be input thereto from an external source, for example, via a storage medium such as a memory card or via communication lines from an external information processor.

The image processor 16 performs image processing, such as various corrections on the input image data, and outputs the processed image data to the laser printer 18 as recording image data. Additionally, the image processor 16 can output the processed image data as an image file to an external device, for example, to an information storage medium such as a memory card, or it can output the data via communication lines to an external information processor.

The laser printer 18 includes red, green and blue laser sources, and it records an image (latent image) on a sheet of photographic paper, which is a silver halide photosensitive material, by scan-exposing the sheet with laser beams which are modulated based on the recording image data input from the image processor 16. The processor 20 then performs various processing, such as color development, bleaching and fixing, washing with water and drying on the sheet of photographic paper on which the image has been recorded by scan-exposure at the laser printer 18. Thus, an image is formed on the sheet of photographic paper.

[Detailed Structure of Laser Printer]

Figure 3:
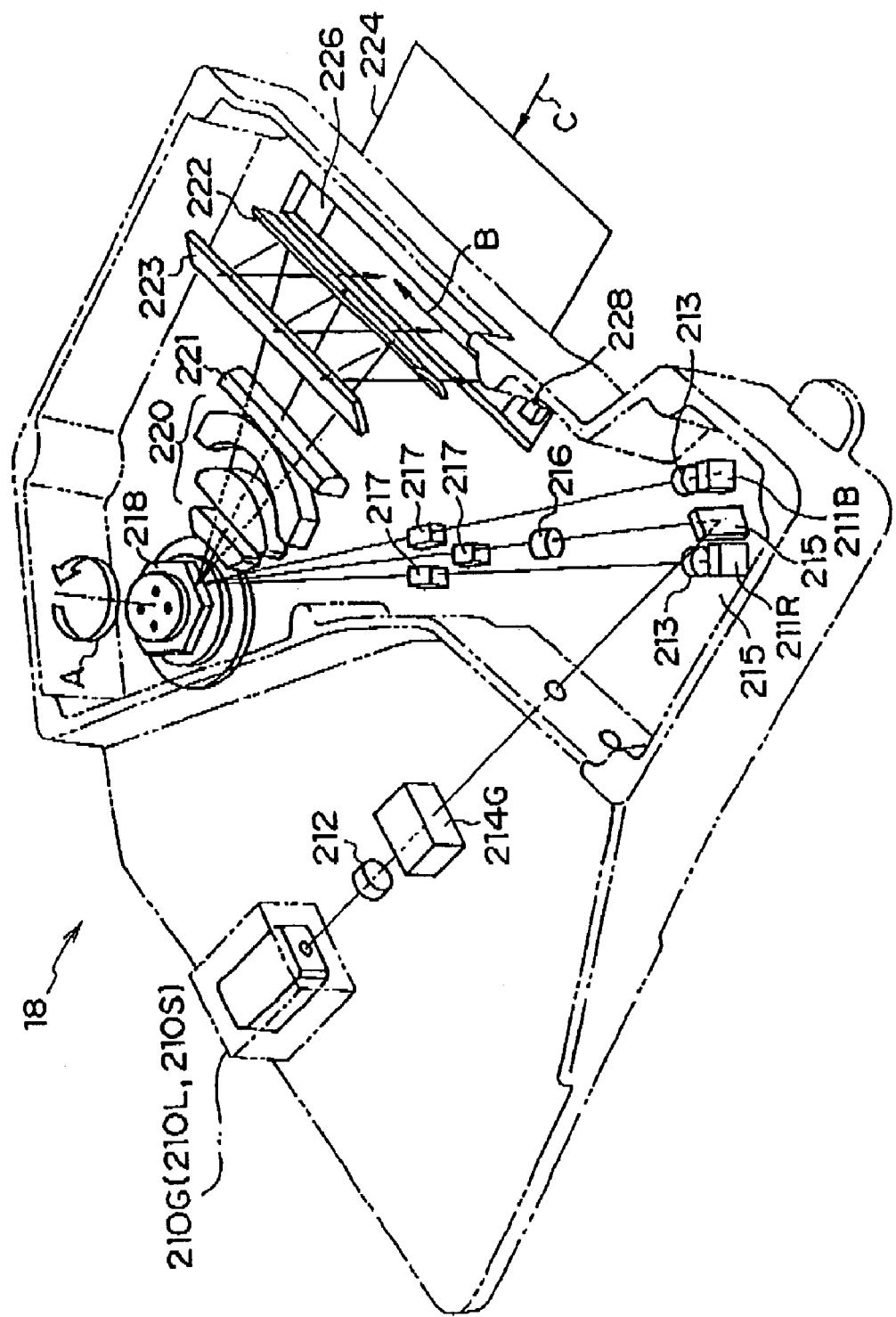
FIG. 3 is a perspective view showing an optical system of a laser printer in the Digital Lab System of FIG. 2.

A structure of the laser printer 18 will now be described in detail. FIG. 3 shows a structure of an optical system of the laser printer 18.

The laser printer 18 includes three laser sources 211R, 210G and 211B. The laser source 211R comprises a semiconductor laser (laser diode) which emits laser light having a wavelength corresponding to R, for example, 685 nm (hereinafter referred to as red laser light). The laser source 210G comprises a laser diode 210L which serves as a laser light emitting means, and a wavelength conversion device (SHG) 210S, which serves as a wavelength converting means for converting the laser light emitted from the laser diode 210L into laser light whose wavelength is one half of that of the laser light emitted from the laser diode 210L. An oscillation wavelength of the laser diode 210L is determined such that laser light having a wavelength corresponding to G, for example, 532 nm (hereinafter referred to as green laser light) is emitted from the SHG 210S. The laser source 211B comprises a GaN based laser diode which emits laser light having a wavelength corresponding to B, for example, 440 nm (hereinafter referred to as blue laser light). The laser sources 211R and 211B are connected to a driver (not shown) and are directly modulated based on a signal input from the driver.

At the laser light emitting side of the laser source 210G, a collimator lens 212 and an acousto-optical device (AOM: Acousto-Optic Modulator) 214G, which serves as an external modulating means, are disposed in this order. The AOM 214G is connected to an AOM driver (not shown), and is disposed such that incident laser light transmits through an acousto-optical medium. When a high frequency signal is input from the AOM driver to the AOM 214G, an ultrasonic wave according to the high frequency signal propagates within the acousto-optical medium, and the laser light transmitting through the acousto-optical medium is diffracted by an acousto-optical effect. As a result, the laser light having intensity corresponding to the amplitude of the high frequency signal is emitted from the AOM 214G as diffracted light. In short, the AOM is an optical modulator utilizing an acoustic diffraction phenomenon in which a refractive index of a material is changed due to an acoustic wave to form an optical diffraction grating.

A flat mirror 215 is disposed at a diffracted light emitting side of the AOM 214G, and a spherical lens 216, a cylindrical lens 217 and the polygon mirror 218 are disposed in the aforementioned order at a laser light emitting side of the flat mirror 215. The green laser light emitted from the AOM 214G as the diffracted light is reflected by the flat mirror 215, passes through the spherical lens 216 and the cylindrical lens 217 to a predetermined position on the reflective surface of a polygon mirror 218, and then is reflected by the polygon mirror 218.

On the other hand, at the laser light emitting side of the laser sources 211R and 211B, the collimator lens 213 and a cylindrical lens 217 are disposed in the aforementioned order. Laser light emitted from the laser sources 211R and 211B is collimated by the collimator lens 213, irradiated through the cylindrical lens 217 onto substantially the same position as the predetermined position above on a reflective surface of a polygon mirror 218, and then reflected by the polygon mirror 218.

The three, red, green and blue laser beams reflected by the polygon mirror 218 sequentially transmit through an fθ lens 220 and a cylindrical lens 221, are reflected by a cylindrical mirror 222, and then are reflected by a mirror 223 downward in a substantially vertical direction to be irradiated on the sheet of photographic paper 224 through an opening 226. It should be noted that the mirror 223 may be omitted and the laser beams may be reflected directly by the cylindrical mirror 222 downward in a substantially vertical direction to be irradiated on the sheet of photographic paper 224.

A start-of-scan-exposure detection sensor (hereinafter referred to as an SOS detection sensor) 228 for detecting the red laser light when the laser light has reached the sensor via the opening 226 is disposed in the vicinity of a position on the sheet of photographic paper 224 where scan-exposure is started. It should be noted that the reasons why the SOS detection sensor 228 detects the red laser light among others are: that the intensity of the red laser light is the highest of all for compensating for the lowest sensitivity to red light of the photographic paper, thereby ensuring detection; that the red laser light reaches the SOS detection sensor 228 the earliest of all during scanning effected by rotation of the polygon mirror 218; and the like. Further, in this embodiment, usually a low-level signal is output from the SOS detection sensor 228, and a high-level signal is output only when the SOS detection sensor 228 has detected the red laser light, the high output signal hereinafter referred to as a sensor output signal.

[Gallium Nitride Based Semiconductor Laser]

Figure 4:
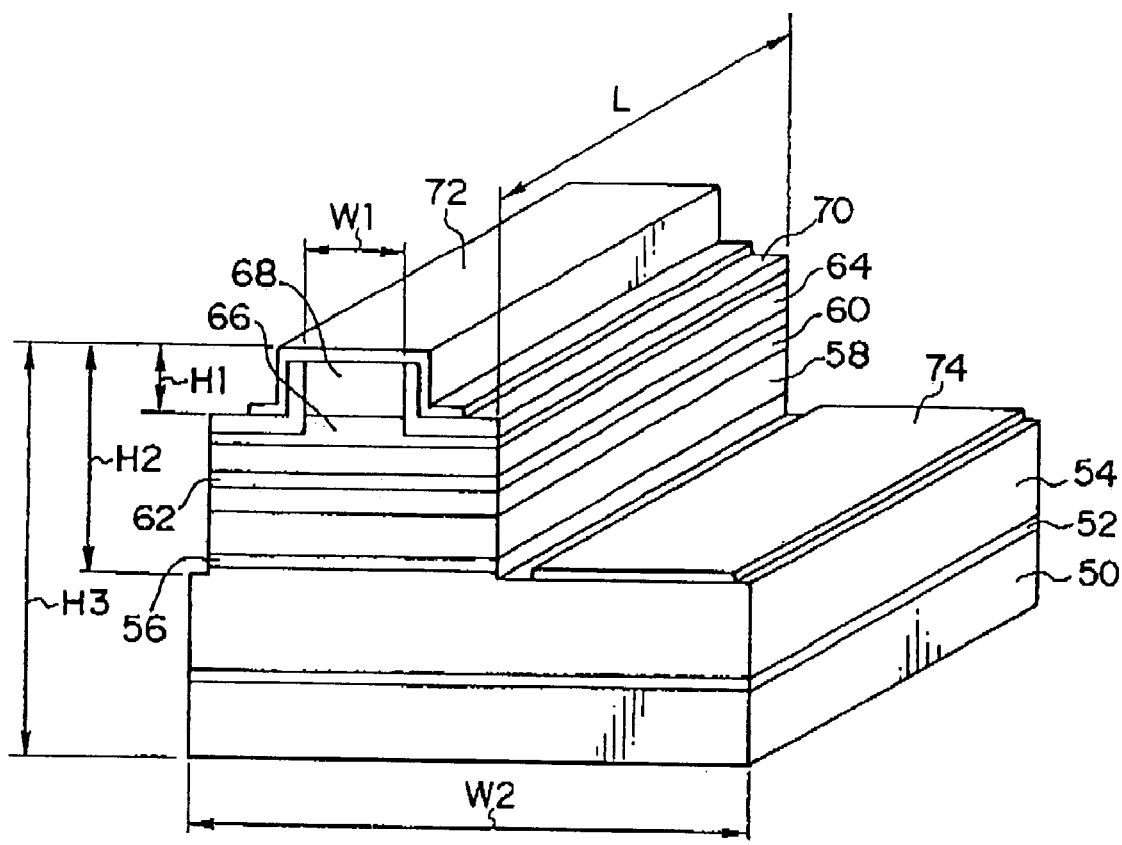
FIG. 4 is a perspective view showing a detailed structure of a GaN based semiconductor laser.
Figure 5:
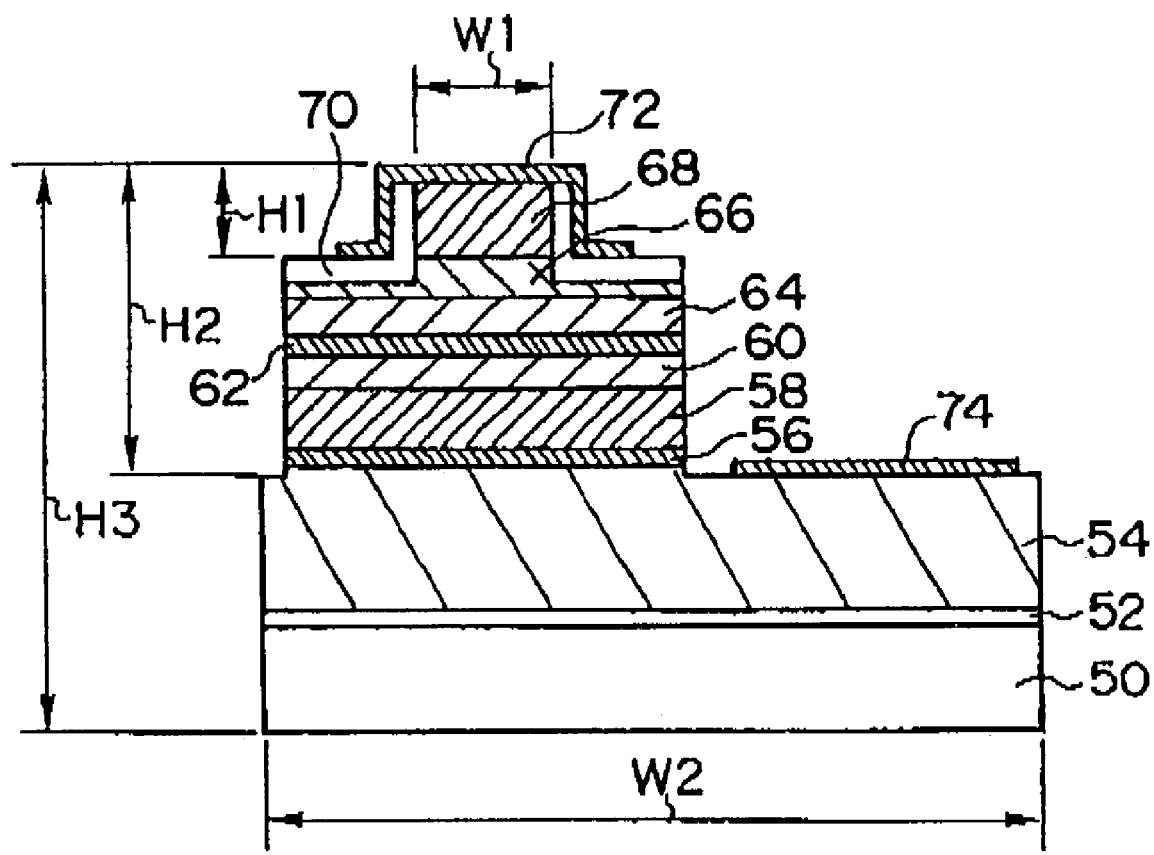
FIG. 5 is a sectional view showing a layered structure of a GaN based semiconductor laser.

Referring to FIGS. 4 and 5, an exemplary structure of a GaN based laser diode with an oscillation wavelength of 440 nm used as the laser source 211B will now be described in detail.

The GaN based laser diode includes a sapphire substrate 50, a low-defect n-GaN base layer 52, an n-GaN buffer layer 54 (silicon (Si)-doped, 5 μm-thick,) an n-$In_{0.1}Ga_{0.9}N$ buffer layer 56 (Si-doped, 1 μm-thick,) an n-$Al_{0.1}Ga_{0.9}N$ cladding layer 58 (Si-doped, 0.45 μm-thick,) an n-GaN guiding layer 60 (Si-doped, 0.08 μm-thick,) an undoped active layer 62, a p-GaN guiding layer 64 (magnesium (Mg)-doped, 0.08 μm-thick,) a p-$Al_{0.1}Ga_{0.9}N$ cladding layer 66 (Mg-doped, 0.45 μm-thick,) and a p-GaN capping layer 68 (Mg-doped, 0.25 μm-thick,) which are grown in the aforementioned order on the sapphire substrate 50.

The active layer 62 has a double quantum well structure including, for example, an undoped $In_{0.05}Ga_{0.95}N$ (10 nm-thick,) an undoped $In_{0.23}Ga_{0.77}N$ quantum well layer (3 nm-thick,) an undoped $In_{0.05}Ga_{0.05}N$ (5 nm-thick,) an undoped $In_{0.03}Ga_{0.77}N$ quantum well layer (3 nm-thick,) an undoped $In_{0.05}Ga_{0.95}N$ (10 nm-thick,) and an undoped $Al_{0.1}Ga_{0.9}N$ (10 nm-thick,) which are grown in the referenced order.

This layered structure has a height (H3) of about 100 μm and a width (W2) of about 300 μm, and includes a post-like mesa which is formed by etching the layered structure until the n-GaN buffer layer 54 is exposed. A height (H2) of the mesa is 3 to 5 μm. The mesa includes ridge stripes which are formed by etching the mesa until the p-$Al_{0.1}Ga_{0.9}N$ cladding layer 66 is exposed. The ridge has a height (H1) of about 0.9 μm. Further, in the drawing, L represents a resonator length, which is represented by the distance from one end to the other end of the structure in FIG. 4, and W1 represents the width of the ridge stripe which is equivalent to the waveguide width. Ranges of the resonator length and the waveguide width are described later.

Exposed surfaces of the p-$Al_{0.1}Ga_{0.9}N$ cladding layer 66 and exposed surfaces of the p-GaN capping layer 68 are covered with a silicon nitride (SiN) film 70. A p-side electrode 72 is formed over the p-GaN capping layer 68 so as to contact an exposed portion of the p-GaN capping layer 68, and an n-side electrode 74 is formed on the exposed n-GaN buffer layer 54. In this laser diode structure, when a current flows from the p-side electrode 72 to the n-side electrode 74, a current path is narrowed by the ridge stripes and the current is efficiently injected into the active layer 62, and a laser beam with an oscillation wavelength of 440 nm is emitted from an end surface of the structure.

Next, a fabrication process of the laser diode having the above-described structure is briefly described. First, over a c-surface of the sapphire substrate 50, the low-defect n-GaN base layer 52 is formed according to a method described in S. Nagahama et al., Jpn. J. Appl. Phys., Vol. 39, No. 7A, p. L647, 2000.

Subsequently, using metalorganic chemical vapor deposition (MOCVD), the n-GaN buffer layer 54, the n-$In_{0.1}Ga_{0.9}N$ buffer layer 56, the n-$Al_{0.1}Ga_{0.9}N$ cladding layer 58, the n-GaN guiding layer 60, the undoped active layer 62, the p-GaN guiding layer 64, the p-$Al_{0.1}Ga_{0.9}N$ cladding layer 66, and the p-GaN capping layer 68 are grown in the aforementioned order.

The substrate is then removed from the growth chamber, and the layered structure is partially etched employing reactive ion beam etching (RIBE) using chlorine as the ion source, until the p-$Al_{0.1}Ga_{0.9}N$ cladding layer 66 is exposed forming the ridge stripes having a width of about 1.7 μm. The p-$Al_{0.1}Ga_{0.9}N$ cladding layer 66 is etched to a point 0.1 μm above a surface of the p-GaN guiding layer 64.

Next, using plasma CVD, the exposed surfaces of the p-$Al_{0.1}Ga_{0.9}N$ cladding layer 66 and the p-GaN capping layer 68 are covered with the SiN 70. Thereafter, a resist mask is formed by photolithography, and the SiN film formed on the upper surface of the ridge is selectively removed by etching. Subsequently, a heat treatment is performed in a nitrogen gas atmosphere to activate the p-impurity.

Then, employing RIBE using chlorine as the ion source, portions of the epitaxial layers, other than those including a light emitting region (which are unnecessary for forming a laser,) are etched until the n-GaN buffer layer 54 is exposed forming the post-like mesa.

Subsequently, Ni(nickel)/Au(gold) are sequentially deposited on the exposed surface of the p-GaN capping layer 68 using vacuum deposition, and Ti(titanium)/Al(aluminium)/Ti/Au are sequentially deposited on the exposed surface of the n-GaN buffer layer 54. The Ni/Au and Ti/Al/Ti/Au are respectively annealed in a nitrogen atmosphere to form ohmic electrodes. Thus, the p-side electrode 72 is formed on the p-GaN capping layer 68 and the n-side electrode 74 is formed on the n-GaN buffer layer 54. Finally, the structure is cleaved to form resonator end mirrors to complete a laser diode.

It should be noted that, instead of the sapphire substrate on which the low-defect n-GaN base layer 52 is formed, an insulative sapphire substrate or a conductive silicon carbide (SiC) substrate can be used. Further, by using ELOG (Epitaxially Lateral Over Growth), in stead of MOCVD, to form respective layers in the layered structure, dislocation in the oscillation stripe region can be reduced as described in Matsushita, Optronics, No. 1, p. 62, 2000.

[Controlling Section]

Figure 12:
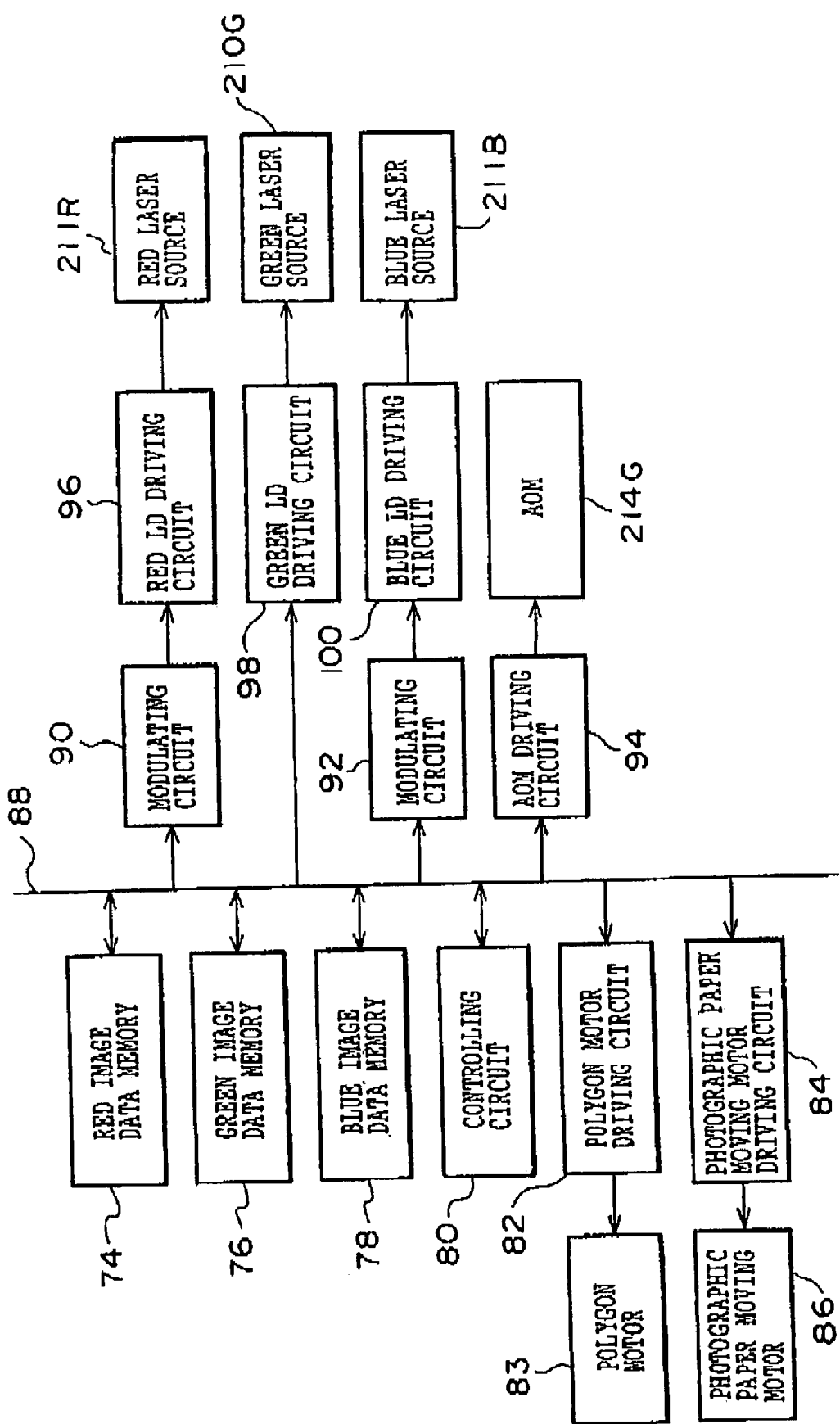
FIG. 12 is a block diagram showing a controlling section of the laser printer.
Figure 13A:
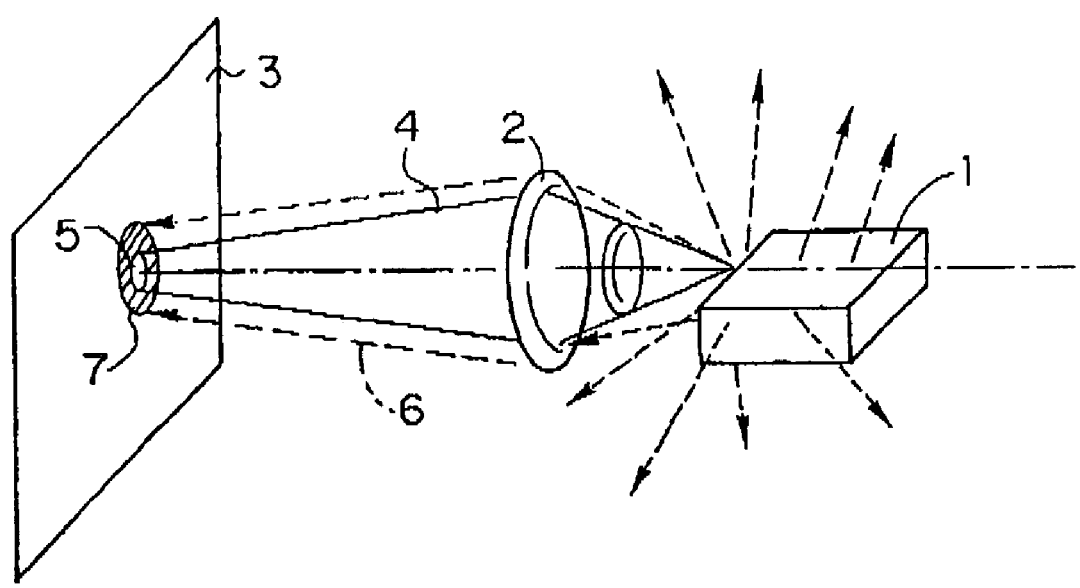
FIG. 13A is a perspective view showing how a sheet of photographic paper is exposed using a conventional exposure apparatus which employs a GaN based semiconductor laser.
Figure 13B:
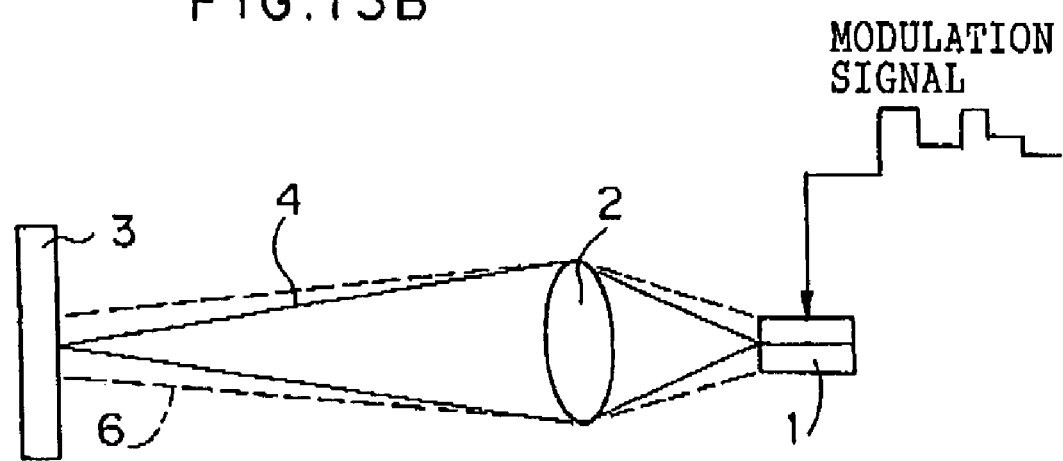
FIG. 13B is a sectional view taken along an optical axis of FIG. 13A.
Figure 14:
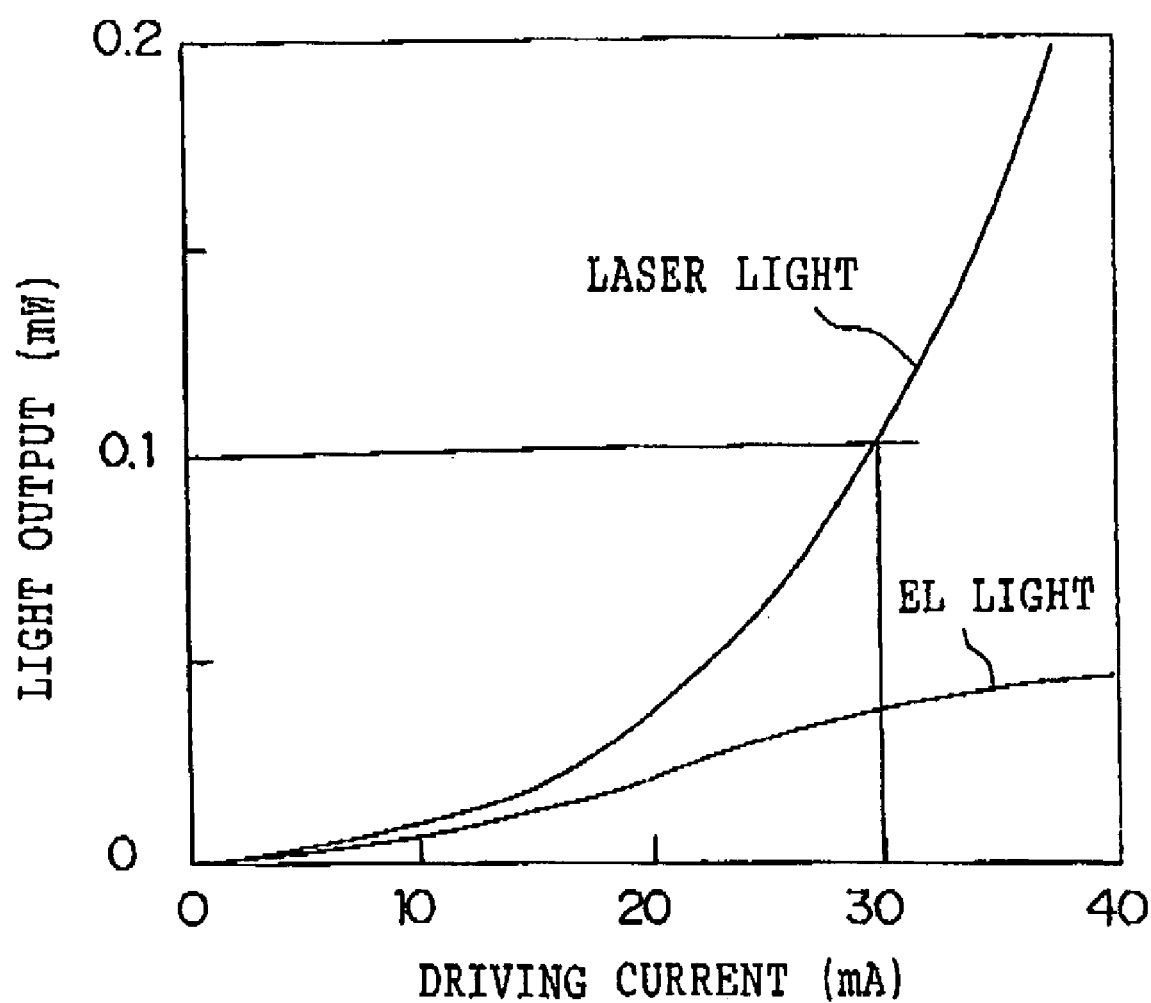
FIG. 14 is a graph showing a relationship between light intensity of light output from a GaN based semiconductor laser on a sheet of photographic paper and a driving current.
Figure 15A:
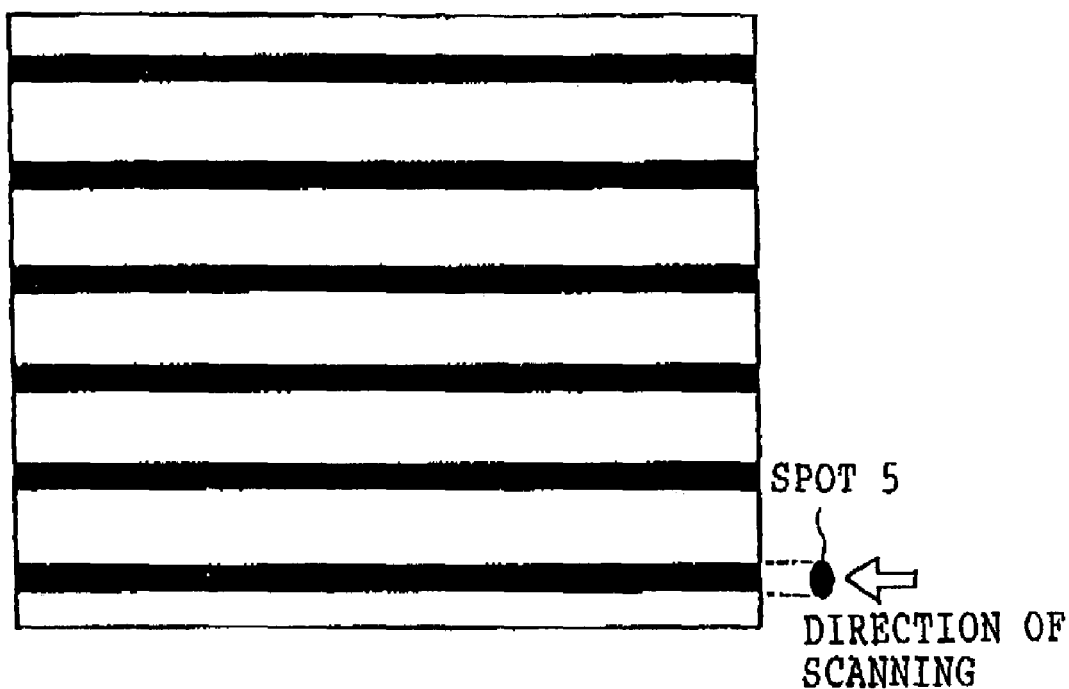
FIG. 15A is a diagram showing a stripe pattern including lines whose width is the same as a diameter of a laser spot.
Figure 15B:
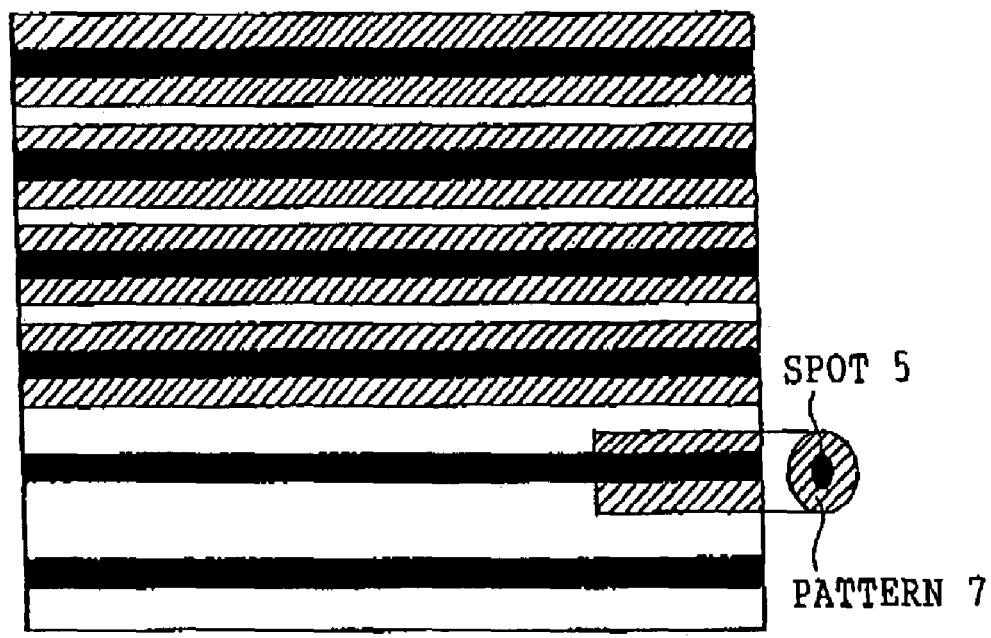
FIG. 15B is a diagram showing an image obtained by exposing the pattern of FIG. 15A using the conventional exposure apparatus which employs the GaN based semiconductor laser.

Next, a controlling section of the laser printer 18, including a driving circuit for driving the laser source 211B which itself includes the GaN based semiconductor laser, is described in detail. As shown in FIG. 12, the controlling section according to the present embodiment includes a controlling circuit 80 including a microcomputer. The controlling circuit 80 is connected to a bus 88. Image data memory 74, 76 and 78 are also connected to the bus 88. The image data memory 74, 76 and 78 serve as memory for storing image data which is used for recording an image on the sheet of photographic paper 224. Image data memory 74 stores red component image data, image data memory 76 stores green component image data, and image data memory 78 stores blue component image data.

Further, a red laser diode driving circuit 96, a green laser diode driving circuit 98 and a blue laser diode driving circuit 100 are connected to the bus 88. The red laser diode driving circuit 96 is connected to the bus 88 via a modulating circuit 90, and the blue laser diode driving circuit 100 is connected to the bus 88 via a modulating circuit 92. That is, intensities of the light emitted from the semiconductor lasers 211R and 211B are directly modulated by superposing the modulation signals generated based on image data by the modulating circuits 90 and 92, respectively, in the laser diode driving circuits.

Furthermore, an AOM driving circuit 94 is connected to the bus 88 for controllably driving the AOM 94. That is, the laser source 210G is indirectly modulated by the AOM 214G. Moreover, a polygon motor driving circuit 82 for driving a polygon motor 83, which rotatably drives the polygon mirror 218, and a photographic paper moving motor driving circuit 84 for driving a photographic paper moving motor 86, which moves the sheet of photographic paper 224, are connected to the bus 88, so that they are respectively controlled by the controlling circuit 80.

[Operation of Laser Printer]

Next, operation of the laser printer 18 is described. When an image is recorded on the sheet of photographic paper 224, the controlling section of the laser printer 18 performs various corrections on the recording image data and generates scan-exposure image data based on image recording parameters, which are input from the image processor 16, in order to record an image represented by the recording image data, which is input from the image processor 16, on the sheet of photographic paper 224 by scan-exposure. Then, the control section stores the generated image data in the memory 74, 76 and 78.

Next, the polygon mirror 218 in the laser printer 18 is rotated in a direction of arrow A in FIG. 3, and electric currents are applied to the semiconductor lasers in the laser sources 211R, 210G and 211B so that they emits red, green and blue laser beams, respectively. At this time, a modulation signal is generated based on the generated scan-exposure image data, and an amplitude of an ultrasonic signal (a high frequency signal), which is supplied to the AOM 214G, is varied according to a level of the modulation signal, thereby modulating the green laser light emitted from the AOM 214G as a diffracted light. Therefore, the AOM 214G emits the green laser light, whose intensity has been modulated according to a density of the image to be recorded on the sheet of photographic paper 224. The green laser light is irradiated on the sheet of photographic paper 224 through the flat mirror 215, the spherical lens 216, the cylindrical lens 217, the polygon mirror 218, the fθ lens 220, the cylindrical lens 221, the cylindrical mirror 222 and the mirror 223.

The laser light emitted from the laser sources 211R and 211B are respectively modulated by modulating intensity of electric current applied to the laser sources 211R and 211B. Therefore, the laser sources 211R and 211B emit red laser light and blue laser light respectively, which are modulated according to a density of image to be recorded on the sheet of photographic paper 224. Each laser light is irradiated on the sheet of photographic paper 224 through the collimator lens 213, the cylindrical lens 217, the polygon mirror 218, the fθ lens 220, the cylindrical lens 221, the cylindrical mirror 222 and the mirror 223.

The image (latent image) is recorded on the sheet of photographic paper 224 by scan-exposure, in which main scanning is effected by scanning a spot of each of the red, green and blue laser beams in a direction of arrow B in FIG. 3 while the polygon mirror 218 is rotated in the direction arrow A in FIG. 3, and sub scanning of each of the laser beams is effected by conveying the sheet of photographic paper 224 in a direction of arrow C in FIG. 3 at a constant speed.

As described above, since the laser source 211B according to the present embodiment uses the GaN based semiconductor laser, light emitted from the laser source 211B includes stray light, whose amount is greater than that of other semiconductor lasers. In the present embodiment, the GaN based semiconductor, having a small radiation angle (35°,) is used to suppress an amount of stray light irradiated on the sheet of photographic paper 224, so that the stray light does not affect the sharpness of an image recorded on the sheet of photographic paper 224.

As described above, the smaller the radiation angle of the GaN based semiconductor laser, the smaller the energy of light at an relative area due to stray light. Therefore, the amount of stray light irradiated on the sheet of photographic paper 224 can be reduced or suppressed by using the GaN based semiconductor laser having a smaller radiation angle.

In addition, by using a semiconductor laser employing a smaller radiation angle, the utilization efficiency of light is not lowered even when a lens having a smaller NA is used in a condensing optical system 73. Further, the ratio of stray light emitted from the GaN based semiconductor laser can also be reduced by reducing the NA of the lens. Thus, the amount of stray light irradiated on the sheet of photographic paper 224 can be reduced or suppressed.

It should be noted that, in the above-described scan-exposure, timing of modulation of each of the laser beams and timing of conveyance of the sheet of photographic paper 224 in the direction of arrow C in FIG. 4 is determined based on the sensor signal output from the SQS detection sensor 228.

The sheet of photographic paper 224, on which the latent image has been recorded by scan-exposure, is then fed to the processor 20, and the processor 20 performs various processing on the sheet of photographic paper, such as color development, bleaching and fixing, washing with water and drying. Thus, an image is formed on the sheet of photographic paper 224.

[Ranges of Waveguide Width and Resonator Length]

Figure 6:
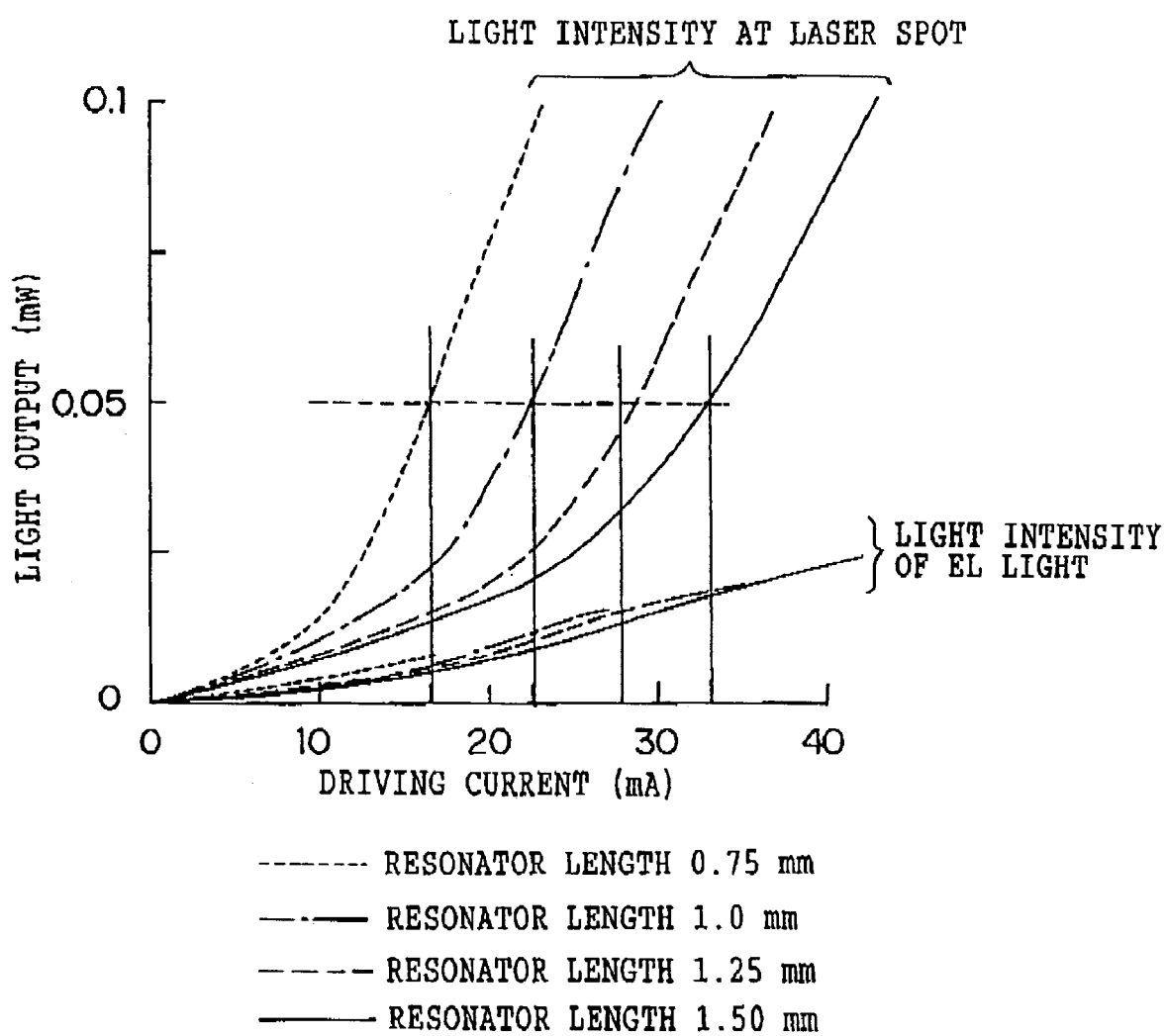
FIG. 6 is a graph showing a relationship between light intensity of light output from the blue laser source on a sheet of photographic paper and a driving current for each of different resonator lengths.

FIG. 6 shows, for each of four resonator lengths L, a relationship between the light intensity of light emitted from the blue laser source 211B, including the GaN based laser diode shown in FIGS. 4 and 5 as measured on a sheet of photographic paper, and a driving current. The relationship when L=1.5 mm is represented by the solid line, the relationship when L=1.25 mm is represented by the long dash line, the relationship when L=1.0 mm is represented by the alternate long and short dash line, and the relationship when L=0.75 mm is represented by the short dash line. A waveguide width W1 of the GaN based laser diode in the present embodiment is 3 µm, and the laser diode has a double quantum well structure including quantum well layers, each having a thickness of 3 nm.

As can be seen from FIG. 6, the light intensity of EL light on the sheet of photographic paper is substantially constant regardless of the resonator length, while, the light intensity of a laser spot on the sheet of photographic paper increases as the resonator length decreases. In other words, the ratio of EL light output, in the light output from the laser diode, decreases as the resonator length decreases. For example, assuming that a light intensity of about 0.05 mW on the sheet of photographic paper is to be obtained, the ratio of EL light output is about 30% of light output from the laser diode when the resonator length is as long as 1.25 mm. The ratio is reduced to about 20% when the resonator length is 1 mm, and the ratio is further reduced to about 15% when the resonator length is as short as 0.75 mm.

Figure 7:
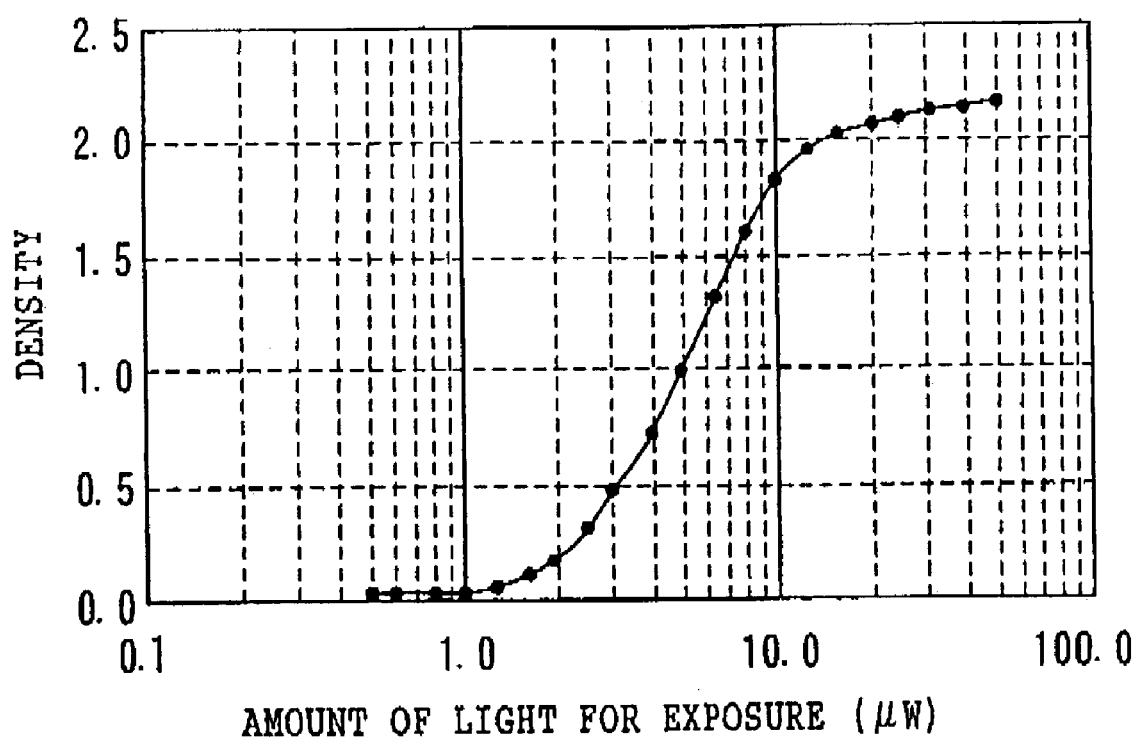
FIG. 7 is a graph showing a sensito-curve when exposure is performed using laser light having a wavelength of 440 nm.

FIG. 7 shows a sensito-curve when exposure is performed using laser light having a wavelength of 440 nm. In order to obtain a sufficient density, it is necessary to perform exposure at light intensity of 50 µW, which is the maximum value in the results of the measurements. As described above, in order to obtain a visually high quality image with excellent sharpness using a silver halide photosensitive material, it is necessary to reduce the ratio of EL light output in the light output from the laser diode to 20% or less. Assuming that light intensity on the sheet of photographic paper is 50 µW and the waveguide width is 3 µm, this condition is satisfied when the resonator length L is 1 mm or less. In other words, it is necessary to set the waveguide width W1 and the resonator length L so that a product of the waveguide width W1 and the resonator length L (W1·L) equals 0.003 mm$^2$ or less. It should also be noted that, in the case in which the waveguide width W1 is varied within a range from 1 to 30 µm, the ratio of EL light output in the light output from the laser diode also becomes 20% or less when the product (W1·L) is 0.003 mm$^2$ or less. In order to further improve sharpness of the image, an upper limit of the product (W1·L) is preferably 0.0025 mm$^2$, and more preferably 0.002 mm$^2$. From a reliability view point, a lower limit of the product (W1·L) is preferably 0.0002 mm$^2$, and more preferably 0.0003 mm$^2$.

In order to ensure reliability of the laser diode, the laser diode needs to have the resonator length L of 0.1 mm or more and the waveguide width W1 of 1 µm or more. When the resonator length L is 0.1 mm, a value for the waveguide width W1 can be selected from a range between 1 µm and 30 µm. When the waveguide width W1 is 1 µm, a value for the resonator length L can be selected from a range between 0.1 mm and 3 mm. With consideration to power consumption, the resonator length L is preferably in a range from 0.1 mm to 1 mm, and more preferably in a range from 0.1 mm to 0.8 mm. In order to obtain a good transverse mode property, the waveguide width W1 is preferably in a range from 1 µm to 4 µm, and more preferably in a range from 1 µm to 3 µm.

As described above, in the present embodiment, the ratio of EL light output in light output from the laser diode can be reduced to 20% or less by using, as the blue laser source (the laser source 211B), the GaN based laser diode having the resonator length of 0.1 mm or more, the waveguide width of 1 µm or more, and the product of the resonator length and the waveguide width being 0.003 mm$^2$ or less. Thus, a high quality image with excellent sharpness can be obtained.

Second Embodiment

A Digital Lab System according to a second embodiment of the invention will now be described. The Digital Lab System of the second embodiment is similar to the Digital Lab System of the first embodiment shown in FIGS. 1 to 5, except that a semiconductor laser used as the laser source 211B in the second embodiment has a property, the radiation angle, different from that of the semiconductor laser used in the first embodiment. Therefore, the same reference numerals are assigned to the same parts, and explanation thereof is omitted.

A structure of the laser source 211B of the second embodiment is basically the same as that of the first embodiment. In the laser source 211B of the second embodiment, W1 is 1.7 µm, W2 is 300 µm, H1 is about 0.9 µm, H2 is about 3.5 µm and H3 is 100 µm.

Figure 8:
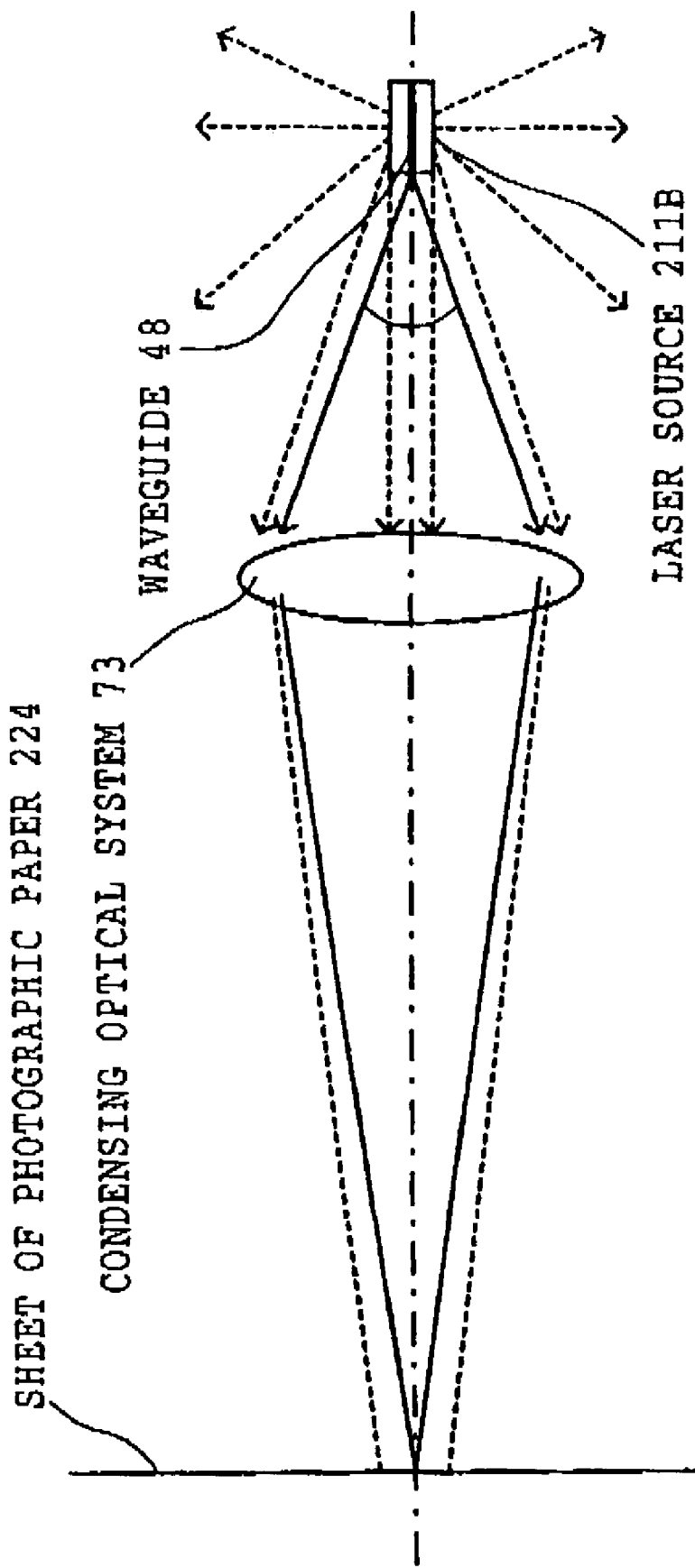
FIG. 8 is a schematic view showing an optical system for a GaN based semiconductor laser according to a second embodiment of the invention.

Next, an optical system for the laser source 211B (the GaN based semiconductor laser) according to the embodiment is described in detail. FIG. 8 schematically shows the optical system for the GaN based semiconductor laser. In order to simplify a representation of the optical system for the GaN based semiconductor laser serving as the laser source 211B in FIG. 8, the condensing optical system 73 is shown as a collective optical system, which includes the collimator lens 213, the cylindrical lens 217, the polygon mirror 218, the fθ lens 220, the cylindrical lens 221, the cylindrical mirror 222 and the mirror 223 described above.

As shown in FIG. 8, the blue laser light emitted from the laser source 211B is irradiated on the sheet of photographic paper 224 through the condensing optical system 73. In the present embodiment, the blue laser light is irradiated on the sheet of photographic paper 224 using the GaN based semiconductor laser. As described above, a very large amount of stray light is emitted from the laser source 211B. The stray light produces blur around a spot that a laser beam irradiated on the sheet of photographic paper 224, and this lowers quality of an image recorded by the laser beam.

Now, the radiation angle of the blue laser light emitted from the laser source 211B is considered. The radiation angle of the blue laser light varies between that in a thickness direction which is perpendicular to the active layer serving as the light-emitting layer of the semiconductor laser and in a direction parallel to the active layer. Generally, the radiation angle in the perpendicular direction is larger than that in the parallel direction. Therefore, an optical system including a condenser lens, which can condense laser light in the perpendicular direction, can sufficiently condense the laser light in the parallel direction. Thus, in the following description, an explanation is made with reference to a sectional view (FIG. 5) taken along the thickness direction of the substrate.

The radiation angle of the laser source 211B is determined by the width of the waveguide 48, which serves as the light-emitting layer of the laser source 211B. As the width of the waveguide is reduced, the radiation angle of the blue laser light emitted from the laser source 211B increases, and as the width of the waveguide is increased, the radiation angle decreases. When a laser source having a large radiation angle is used, it is necessary to use a condenser lens having a large numerical aperture in order to efficiently irradiate the laser light on the sheet of photographic paper 224. In contrast, when a laser source having a small radiation angle is used, a condenser lens having a small numerical aperture can be used to efficiently irradiate the laser light on the sheet of photographic paper 224. It is preferable to use a lens having a small numerical aperture in order to remove stray light, since a condenser lens having a large numerical aperture condenses much of the stray light emitted from the laser source 211B.

Therefore, in this embodiment, a GaN based semiconductor laser having a small radiation angle is used as the laser source 211B, and corresponding to this small radiation angle, the optical system 73 includes a condensing lens having a small numerical aperture is used. Thus, an amount of stray light to be condensed by the optical system 73 can be reduced. Therefore, in the exposure device of this embodiment, light energy with an ambiguous pattern around a laser spot is smaller than that in conventional devices, and the phenomenon of coloring throughout the sheet of photographic paper 224, which is particularly problematic in a silver halide exposing system, can be suppressed.

Figure 9:
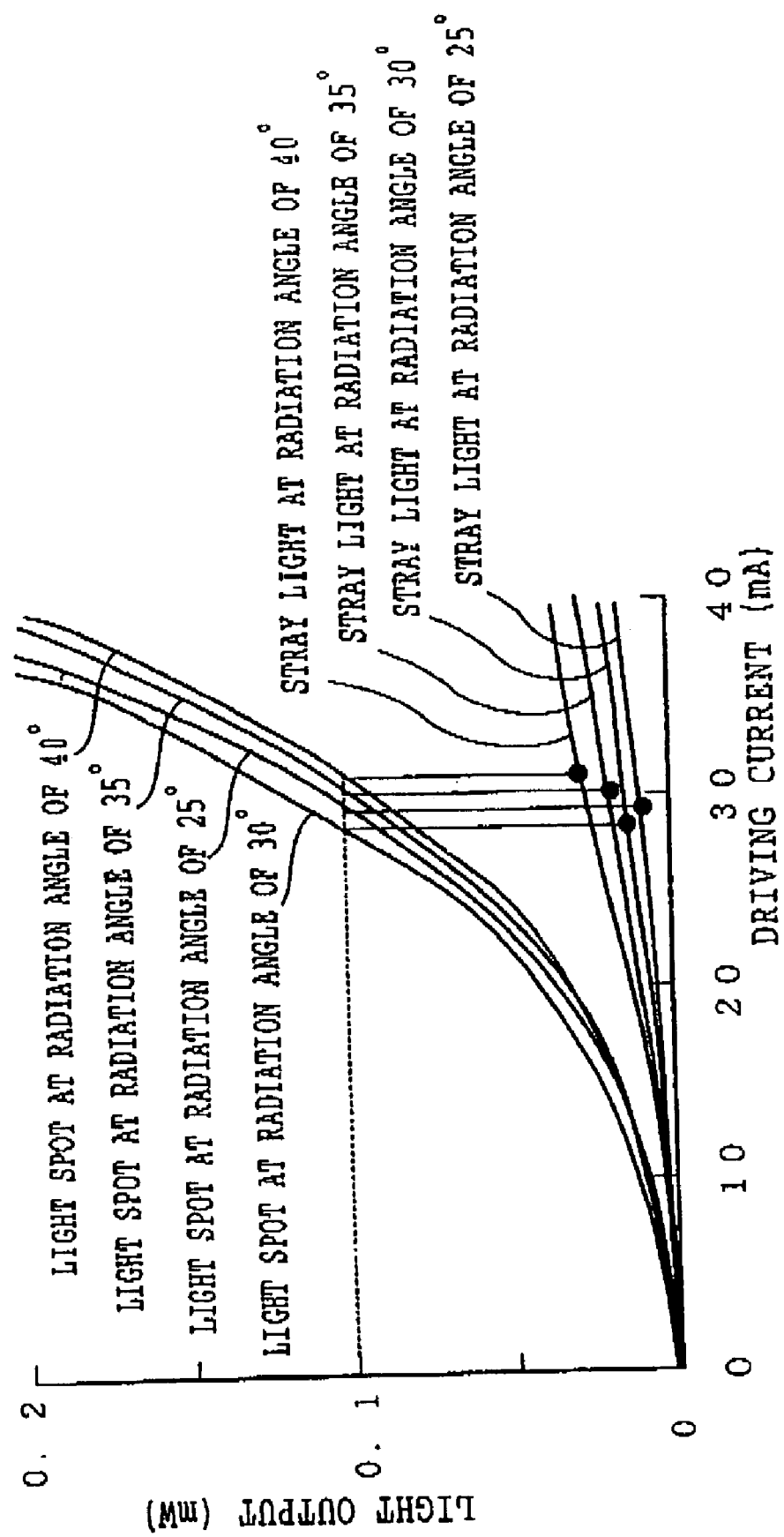
FIG. 9 is a graph showing I-L characteristics of GaN based semiconductor lasers.

FIG. 9 shows I-L characteristics of GaN based semiconductor lasers concerning the light power of a spot of blue laser light condensed by the condensing optical system 73, in which laser light is emitted from one of GaN based semiconductor lasers, whose radiation angle is 40°, 35°, 30° and 25°, respectively, and in which the light power of an ambiguous area around the light spot is due to stray light.

It should be noted that, in order to improve utilization efficiency of the light from the GaN based semiconductor laser, a lens having a NA as large as 0.71 is used when the radiation angle is 40°. For each of GaN based semiconductor lasers having different radiation angles, a lens having a NA which is proportional to the radiation angle is used. Specifically, a lens having a NA being equal to $\sin \theta$, where $\theta$ represents a full angle of radiation at half maximum of the semiconductor laser is used. Namely, in correspondence with the radiation angles of the blue laser light emitted from the GaN based semiconductor lasers, lenses respectively having numerical apertures of 0.57 (corresponding to the radiation angle of 35°,) 0.5 (corresponding to the radiation angle of 30°) and 0.42 (corresponding to the radiation angle of 25°) are used.

Figure 10:
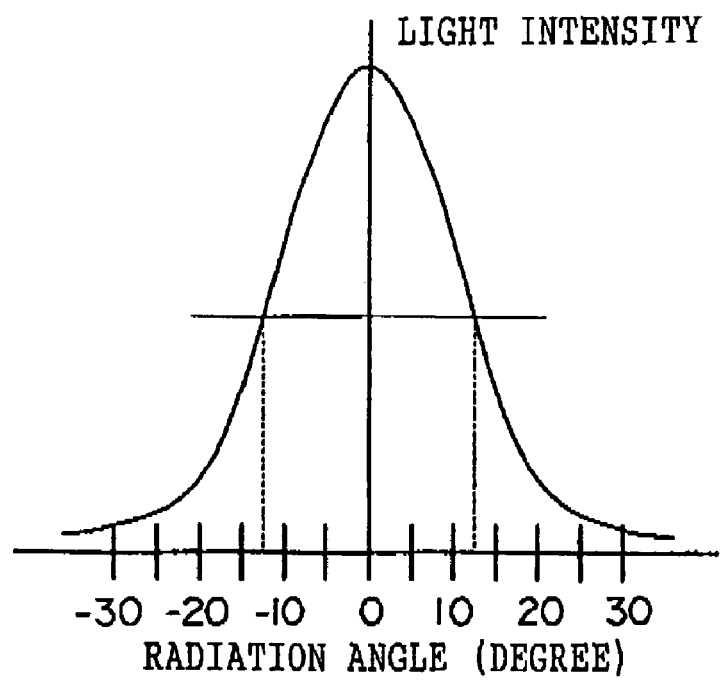
FIG. 10 is a graph showing a distribution of light intensity relative to an angle of radiation in a far-field pattern when a radiation angle is 25°.
Figure 11:
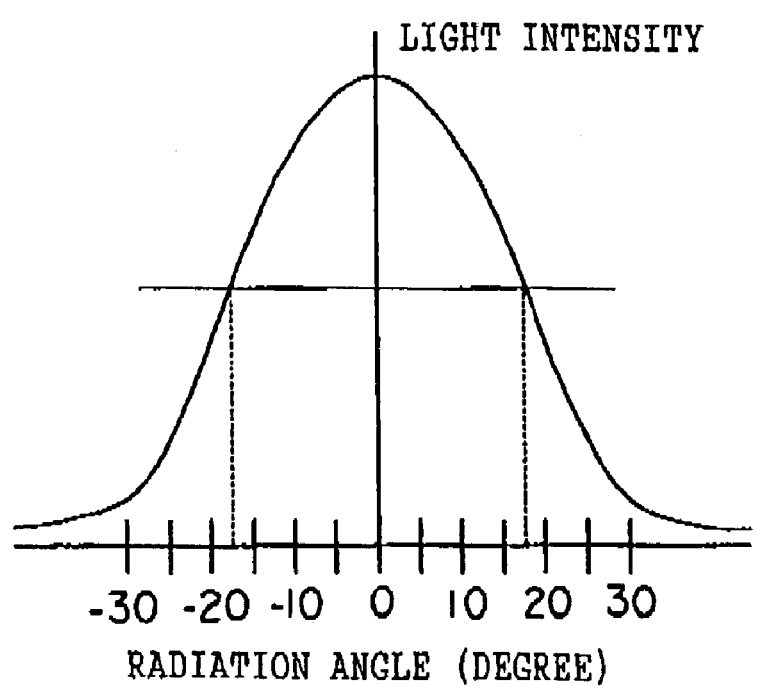
FIG. 11 is a graph showing a distribution of light intensity relative to an angle of radiation in a far-field pattern when a radiation angle is 35°.

As shown in FIGS. 10 and 11, the radiation angle refers to a full angle of radiation, at which a radiation angle in a far-field pattern and light intensity in a light intensity distribution become half maximum. FIG. 10 shows a radiation angle in a far-field pattern and a light intensity distribution corresponding to a radiation angle of 25°, and FIG. 11 shows a radiation angle in a far-field pattern and a light intensity distribution corresponding to a radiation angle of 35°.

It can be seen from FIG. 9 that the smaller the radiation angle of the blue laser light emitted from the GaN based semiconductor laser, the smaller the light energy at the ambiguous area due to stray light.

In order to have coloring at the ambiguous areas within a acceptable range with respect to sharpness, it is most desirable that the energy at the ambiguous area, which is condensed by the condensing optical system 73 shown in FIG. 8, is one fifth or less of the energy at the spot, even when any other approach is used in combination.

Further, around a light output of 0.1 mW, which is actually used by the exposure device for a silver halide system, it is at a minimum desirable that the radiation angle is 35° or less in order to satisfy the above-described condition (one fifth of the energy of a spot at an exposed area). Therefore, in this embodiment, a GaN based semiconductor laser having a radiation angle of 35° is used. By using the GaN based semiconductor laser having a radiation angle of 35°, the light energy at the ambiguous area due to stray light can be reduced or suppressed as described above. It should be noted that the radiation angle of the GaN based semiconductor laser can be adjusted to a desired angle by adjusting thicknesses of the n-GaN light-guiding layer 60 and the p-GaN light-guiding layer 64.

Further, by using the GaN based semiconductor laser having the small radiation angle, a lens having a small NA can be used. This also suppresses an amount of stray light to be condensed by the lens.

It should be noted that a plurality of GaN based semiconductor lasers having different radiation angles may be provided so that one of the GaN based semiconductor lasers can be selected according to a signal-noise ratio of the sheet of photographic paper 224.

Although the GaN based semiconductor laser having the radiation angle of 35° is used as the laser source 211B in the above-described embodiment, a GaN based semiconductor laser having any radiation angle which is 35° or less can be used to reduce stray light, as described above.

Additionally, the first embodiment and the second embodiment may be combined. For example, the semiconductor laser of the second embodiment can have a resonator length of 0.1 mm or more, a waveguide width of 1 µm or more, with the product of the waveguide width and the resonator length being 0.003 $mm^2$ or less to reduce stray light, as described in the first embodiment, and thicknesses of the n-GaN light-guiding layer and p-GaN light-guiding layer of the semiconductor laser can be adjusted so that the radiation angle of the laser becomes 35° or less, as described in the second embodiment. This arrangement can also reduce stray light similarly to the first and the second embodiments, and a high quality image with excellent sharpness can be obtained. If the resonator length is limited to be short, gain of the laser resonator is similarly limited. Moreover, in order to reduce a radiation angle of a beam, increasing the diameter of a light spot within the laser in a direction perpendicular to the junction is needed. The increasing of the diameter of a light spot leads to a reduction in the light confinement coefficient of the active layer and gain. These two factors lead to an increase in operating current. Therefore, it is not preferable to set the resonator length extremely small. For example, a resonator length within a range from 0.5 mm to 1 mm and a radiation angle within a range from 28° to 35° is practical.

As described above, the gallium nitride based semiconductor laser and the image exposure device according to the present invention has an effect that, by reducing a ratio of EL light to be output, a high quality image with excellent sharpness can be obtained when a silver halide photosensitive material is exposed.

What is claimed is:

1. An apparatus comprising a gallium nitride based semiconductor laser emitting laser light accompanied by stray light, wherein the ratio of the output of the stray light to the output of the laser light is reduced by setting a waveguide width, an active layer thickness and a resonator length such that the product of the waveguide width, the active layer thickness and the resonator length becomes a predetermined value, so that, when a photosensitive material is exposed to form a continuous tone image, areas on the photosensitive material being exposed by the stray light are not visually perceptible;
wherein the gallium nitride based semiconductor laser comprises a substrate which is transparent to a light of an emission wavelength of the semiconductor laser.

2. The apparatus according to claim 1, wherein the ratio of an output of the stray light to an output of the laser light is reduced to 20% or less.

3. The apparatus according to claim 1, wherein the resonator length is 0.1 mm or more, the waveguide width is 1 μm or more, and the product of the resonator length and the waveguide width is 0.003 mm$^2$ or less.

4. The apparatus according to claim 3, wherein the resonator length ranges from 0.1 mm to 1 mm.

5. The apparatus according to claim 3, wherein the waveguide width ranges from 1 μm to 4 μm.

6. The apparatus according to claim 3, wherein the product of the resonator length and the waveguide width ranges from 0.0002 mm$^2$ to 0.003 mm$^2$.

7. The apparatus according to claim 1, wherein the gallium nitride based semiconductor laser has an oscillation wavelength of 440 nm.

8. The apparatus according to claim 1, wherein said gallium nitride based semiconductor laser comprises:
   a sapphire substrate;
   a low-defect n-GaN base layer;
   an n-GaN buffer layer;
   an n-In0.1Ga0.9N buffer layer;
   an n-Al0.1Ga0.9N cladding layer;
   an n-GaN guiding layer;
   an undoped active layer,
   a p-GaN guiding layer;
   a p-Al0.1Ga0.9N cladding layer; and
   and a p-GaN capping layer.

9. The apparatus according to claim 1, wherein said active layer is double quantum well structure comprising:
   an undoped In0.05Ga0.95N;
   an undoped In0.23Ga0.77N quantum well layer;
   an undoped In0.05Ga0.95N;
   an undoped In0.23Ga0.77N quantum well layer;
   an undoped In0.05Ga0.95N; and
   an undoped Al0.1Ga0.9N.

10. The apparatus according to claim 1, wherein a width representing the width of the ridge stripe which is equivalent to the waveguide width is 1.7 μm and a height of a mesa is 3 to 5 μm.

11. An apparatus comprising a gallium nitride based semiconductor laser emitting laser light accompanied by stray light comprising:
   a waveguide layer;
   an active layer; and
   a resonator length,
   wherein the ratio of the output of the stray light to the output of the laser light is reduced by setting a waveguide width, an active layer thickness and a resonator length such that the product of the waveguide width, the active layer thickness and the resonator length becomes a predetermined value,
   wherein areas on the photosensitive material being exposed by the stray light are not visually perceptible; and
   wherein the gallium nitride based semiconductor laser comprises a substrate which is transparent to a light of an emission wavelength of the semiconductor laser.

12. An image exposure device for scan-exposing a photosensitive material to form an image thereon using laser light, comprising a gallium nitride based semiconductor laser emitting the laser light accompanied by stray light, wherein
   the gallium nitride based semiconductor laser comprises a light-emitting layer for emitting the laser light, and wherein the angle of radiation at half maximum of the laser light is 35° or less.

13. The image exposure device according to claim 12, wherein
   the ratio of the output of the stray light to the output of the laser light is reduced by setting a waveguide width, an active layer thickness and a resonator length such that a product of the waveguide width, the active layer thickness and the resonator length becomes a
   predetermined value, so that, when a photosensitive material is exposed to form a continuous tone image, areas on the photosensitive material being exposed by the stray light are not visually perceptible.

14. The image exposure device according to claim 13, wherein the ratio of an output of the stray light to an output of the laser light is reduced to 20% or less.

15. The image exposure device according to claim 12, wherein the resonator length is 0.1 mm or more, the waveguide width is 1 μm or more, and the product of the resonator length and the waveguide width is 0.003 mm$^2$ or less.

16. The image exposure device according to claim 15, wherein the resonator length ranges from 0.5 mm to 1 mm.

17. The image exposure device according to claim 16, wherein the radiation angle ranges from 28° to 35°.

18. The image exposure device according to claim 17, wherein the radiation angle is adjustable by adjusting the thickness of the guiding layer of the gallium nitride based semiconductor laser.

19. The image exposure device according to claim 12, wherein the photosensitive material is comprised of a silver halide photosensitive material.

20. The image exposure device according to claim 12, wherein the gallium nitride based semiconductor laser has an oscillation wavelength of 440 nm.

21. The image exposure device according to claim 12, wherein the gallium nitride based semiconductor laser comprises a substrate which is transparent to a light of an emission wavelength of the semiconductor laser.

22. The image exposure device according to claim 12, wherein a ridge stripe structure is formed at an upper side of an active layer.

23. The image exposure device according to claim 12, wherein ridge side surfaces are covered with a silicon nitride film.

24. An image exposure method comprising scan-exposing a photosensitive material to form an image thereon using laser light, using a gallium nitride based semiconductor laser emitting the laser light accompanied by stray light, wherein
   the ratio of the output of the stray light to the output of the laser light is reduced by setting a waveguide width, an active layer thickness and a resonator length such that the product of the waveguide width, the active layer thickness and the resonator length becomes a predetermined value, so that, when a photosensitive material is exposed to form a continuous tone image, areas on the photosensitive material being exposed by the stray light are not visually perceptible;

wherein the gallium nitride based semiconductor laser comprises a substrate which is transparent to a light of an emission wavelength of the semiconductor laser.

25. The image exposure method according to claim 24, wherein the ratio of an output of the stray light to an output of the laser light is reduced to 20% or less.

26. The image exposure method according to claim 24, wherein the resonator length is 0.1 mm or more, the waveguide width is 1 μm or more, and the product of the resonator length and the waveguide width is 0.003 mm$^2$ or less.

27. The image exposure method according to claim 24, wherein the photosensitive material is comprised of a silver halide photosensitive material.

* * * * *